(12) United States Patent
Tamura et al.

(10) Patent No.: US 7,781,813 B2
(45) Date of Patent: Aug. 24, 2010

(54) FERROELECTRIC MEMORY DEVICE AND METHOD FOR MANUFACTURING FERROELECTRIC MEMORY DEVICE

(75) Inventors: Hiroaki Tamura, Fujimi (JP); Shuji Tsuruta, Fujimi (JP)

(73) Assignee: Seiko Epson Corporation (JP)

( * ) Notice: Subject to any disclaimer, the term of this patent is extended or adjusted under 35 U.S.C. 154(b) by 133 days.

(21) Appl. No.: 11/685,360

(22) Filed: Mar. 13, 2007

(65) Prior Publication Data
US 2007/0215923 A1 Sep. 20, 2007

(30) Foreign Application Priority Data
Mar. 14, 2006 (JP) .............................. 2006-069095

(51) Int. Cl.
*H01L 21/336* (2006.01)
(52) U.S. Cl. .............................. 257/295; 257/E29.164; 257/E29.272; 438/3
(58) Field of Classification Search .......... 257/E29.164, 257/E29.272, 295; 438/3
See application file for complete search history.

(56) References Cited

U.S. PATENT DOCUMENTS 6,114,764 A * 9/2000 Hoshino et al. ............. 257/751
6,635,528 B2 * 10/2003 Gilbert et al. ............... 438/253
7,297,999 B1 * 11/2007 Wang .......................... 257/296
2001/0040249 A1 * 11/2001 Jung ........................... 257/295
2001/0055820 A1 * 12/2001 Sakurai et al. ................ 438/3
2002/0066914 A1 * 6/2002 Imai et al. .................... 257/295
2003/0030117 A1 * 2/2003 Iwasaki et al. .............. 257/411
2005/0035384 A1 * 2/2005 Kim et al. .................... 257/295
2007/0045688 A1 * 3/2007 Sashida ...................... 257/295

FOREIGN PATENT DOCUMENTS

JP 11-150240 6/1999

* cited by examiner

*Primary Examiner*—David Vu
*Assistant Examiner*—Brandon Fox
(74) *Attorney, Agent, or Firm*—Harness, Dickey & Pierce, P.L.C.

(57) ABSTRACT

A ferroelectric memory device is equipped with a ferroelectric capacitor having a first electrode, a second electrode, and a ferroelectric layer between the first and second electrodes, and the ferroelectric memory device includes: a wiring that is connected to one of the first electrode and the second electrode, wherein the wiring includes a first wiring layer composed of titanium nitride oriented along a <111> direction, and a second wiring layer formed on the first wiring and composed of titanium aluminum nitride orientated along a <111> direction.

8 Claims, 5 Drawing Sheets

FERROELECTRIC MEMORY DEVICE AND METHOD FOR MANUFACTURING FERROELECTRIC MEMORY DEVICE

The entire disclosure of Japanese Patent Application No. 2006-069095, filed Mar. 14, 2006 is expressly incorporated by reference herein.

BACKGROUND

1. Technical Field

The present invention relates to a ferroelectric memory device and a method for manufacturing a ferroelectric memory device.

2. Related Art

A ferroelectric memory device (FeRAM) is a nonvolatile memory that is capable of high-speed operation at low voltages, and its memory cell can be composed with one transistor and one capacitor (1T/1C). Accordingly, ferroelectric memory devices can be integrated to the level of integration of DRAMs, and therefore are highly expected as large-capacity nonvolatile memories. A ferroelectric capacitor composing such a ferroelectric memory device has a structure in which a ferroelectric layer is sandwiched between upper and lower electrodes, and a wiring is connected to each of the electrodes for electrically conducting the electrodes to a peripheral circuit. In this connection, an example of related art is described in Japanese laid-open patent application JP-A-11-150240.

When titanium aluminum nitride (TiAlN) is used as the wiring, its resistance would become very high if the TiAlN is fully nitrided. The resistance can be suppressed low if promotion of nitrization is suppressed, but this method may be accompanied by various disadvantages in return for its benefit. For example, (1) its constituent element Al becomes free and readily diffuses in the capacitor; (2) its oxidation resistance property weakens; and (3) the hydrogen barrier capability may not be achieved.

SUMMARY

In accordance with an aspect of an embodiment of the present invention, it is possible to provide a highly reliable ferroelectric memory device having a ferroelectric capacitor which, even when titanium aluminum nitride is used as a wiring for electrically connecting a ferroelectric capacitor and a peripheral circuit or the like, can keep the resistance low, and does not cause the aforementioned problems, in which (1) its constituent element Al becomes free and readily diffuses in the capacitor; (2) its oxidation resistance property weakens; and (3) the hydrogen barrier capability cannot be realized. Also, in accordance with another aspect of an embodiment of the present invention, it is possible to provide a method for manufacturing the ferroelectric memory device described above.

A ferroelectric memory device in accordance with an embodiment of the invention pertains to a ferroelectric memory device equipped with a ferroelectric capacitor having a first electrode, a second electrode, and a ferroelectric layer between the first and second electrodes, and the ferroelectric memory device includes a wiring that is connected to the first electrode or the second electrode, wherein the wiring includes a first wiring layer composed of titanium nitride oriented along a <111> direction, (or titanium nitride shows (111) orientation) and a second wiring layer formed on the first wiring and composed of titanium aluminum nitride oriented along a <111> direction. (or titanium aluminum shows (111) orientation In the ferroelectric memory device described above, the wiring that is connected to the electrode of the ferroelectric capacitor includes the first wiring layer composed of titanium nitride oriented along a <111> direction, and the second wiring layer composed of titanium aluminum nitride oriented along a <111> direction, such that the wiring has an excellent crystal orientation. The wiring having an excellent crystal orientation can suppress an increase in the resistance value, even when the wiring is fully nitrided by increasing the amount of nitrogen content to a high level. Also, because the wiring can be sufficiently nitrided with a large amount of nitrogen content, (1) the constituent element Al can be prevented from becoming free and diffusing into the ferroelectric capacitor; (2) the oxidation resistance can be prevented from being weakened; and (3) the hydrogen barrier capability can be provided. As a result, a highly reliably ferroelectric memory device can be provided.

In the ferroelectric memory device described above, an interlayer dielectric film may be provided on the ferroelectric capacitor, and the wiring can be connected to the first electrode or the second electrode through a contact hole formed in the interlayer dielectric film. A wiring with an excellent crystal orientation composed of the first wiring layer and the second wiring layer can also be formed in the contact hole formed in the interlayer dielectric film, such that the wiring has a low resistance, and the wiring can be equipped with oxidation resistant property and hydrogen barrier property.

Also, the wiring can be formed in a manner to cover the ferroelectric capacitor as viewed in a plan view. In this case, the hydrogen barrier property with the ferroelectric capacitor can be further improved.

The titanium aluminum nitride composing the second wiring layer may be expressed by $Ti_{(1-x)}Al_xN_y$, ($0<x\leq0.3$, $0.5\leq y\leq1.5$). When the nitrogen composition ratio y of the titanium aluminum nitride is less than 0.5, the oxidation resistance property may become slightly lower, and the hydrogen barrier property may also become slightly lower, because the nitrogen content is extremely low. When the nitrogen composition ratio y of the titanium aluminum nitride exceeds over 1.5, the resistance value may become slightly higher, because the nitrogen content is extremely high.

A method for manufacturing a ferroelectric memory device in accordance with another embodiment of the invention includes the steps of: forming, on a substrate, a ferroelectric capacitor having a first electrode, a second electrode, and a ferroelectric layer between the first electrode and the second electrode; forming an interlayer dielectric film over the substrate including the ferroelectric capacitor; forming a contact hole in the interlayer dielectric film which opens to the second electrode; forming, on the interlayer dielectric film including an interior of the contact hole, a first wiring layer composed of titanium nitride oriented in a <(111.> direction; and forming, on the first wiring layer, a second wiring layer composed of titanium aluminum nitride oriented in a <111> direction.

By the manufacturing method described above, a ferroelectric memory device in accordance with the invention described above can be favorably manufactured. Concretely, in the step of forming the wiring, the first wiring layer composed of titanium nitride oriented in a <111> direction is formed, and then the titanium aluminum nitride film is formed on the first wiring layer, such that the titanium aluminum nitride reflects the crystal structure of the first wiring layer that is the base layer, and thus is provided with an orientation in a, <111> direction. As a result, a ferroelectric memory device having the structure described above can be provided. In this case, because the wiring with an excellent crystallinity is provided, an increase in the resistance value can be suppressed even when the wiring is fully nitrided by increasing the amount of nitrogen content in titanium aluminum nitride to a high level. Also, because the wiring can be sufficiently nitrided with a large amount of nitrogen content, (1) the constituent element Al can be prevented from becoming free and diffusing into the ferroelectric capacitor; (2) the oxidation resistance can be prevented from being weakened; and (3) the hydrogen barrier capability can be provided. As a result, a highly reliable ferroelectric memory device can be provided.

Furthermore, the step of forming the first wiring layer may include the steps of forming a titanium layer on the interlayer dielectric film including an interior of the contact hole, and nitriding the titanium layer to form a titanium nitride layer. By the process for forming the first wiring layer, the first wiring layer composed of a titanium nitride layer oriented in a <111> direction can be readily and securely formed. In other words, by forming the titanium layer that is self-aligned to a (001) orientation, and then nitriding the layer, the titanium nitride layer that is oriented to a, <111> direction can be formed.

Also, the step of forming the first wiring layer may include the step of applying an ammonia plasma treatment to the interlayer dielectric film including an interior of the contact hole. By conducting such an ammonia plasma treatment, the (111) orientation of a titanium nitride layer can be improved.

It is noted that the first wiring layer and the second wiring layer may be formed by a CVD method. Also, as the first electrode and the second electrode may be formed from, for example, iridium, platinum, ruthenium, iridium oxide, ruthenium oxide, or platinum oxide. Moreover, the ferroelectric layer may be formed from, for example, a perovskite type oxide represented by, for example, lead zirconate titanate (Pb(Zr, Ti)O$_3$, hereafter abbreviated as PZT), or a bismuth laminar compound such as SrBi$_2$Ta$_2$O$_9$ or the like.

DESCRIPTION OF EXEMPLARY EMBODIMENTS

Preferred embodiments of the invention are described below with reference to the accompanying drawings.

Ferroelectric Memory Device

Figure 1:
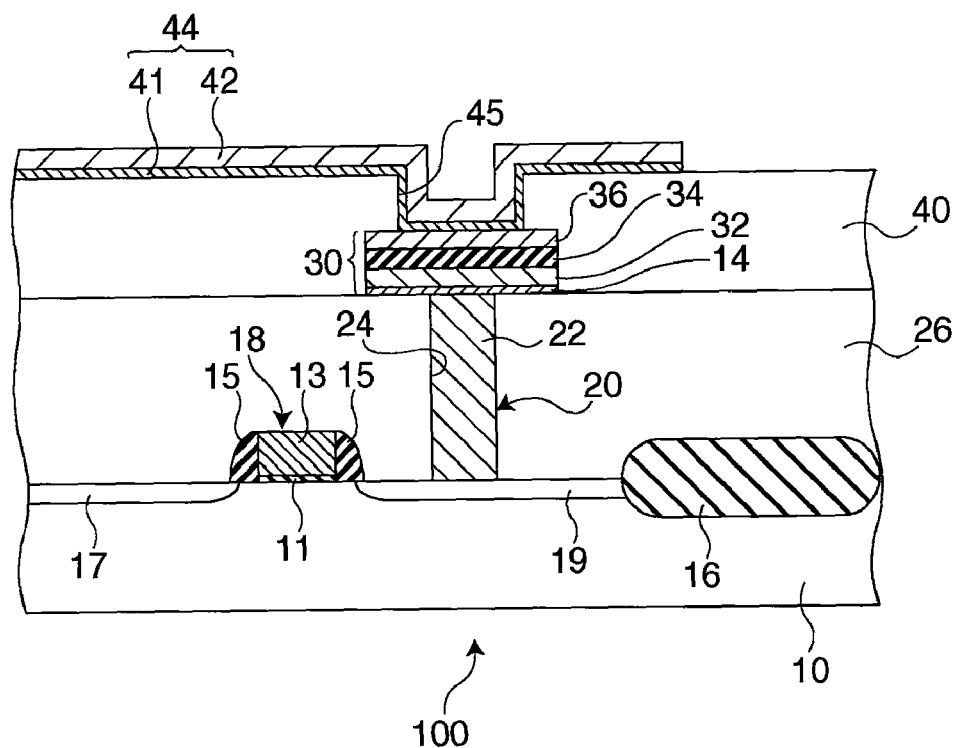
FIG. 1 schematically shows a cross-sectional view of a ferroelectric memory device in accordance with an embodiment of the invention.

FIG. 1 schematically shows a cross-sectional view of a ferroelectric memory device 100 in accordance with an embodiment of the invention. As shown in FIG. 1, the ferroelectric memory device 100 includes a ferroelectric capacitor 30, a plug 20, a wiring 44, and a switching transistor 18 for the ferroelectric capacitor 30, which are formed above a semiconductor substrate 10. It is noted that, although the present embodiment is described with reference to a 1T/1C type memory cell, the applicability of the invention is not limited to a 1T/1C type memory cell.

The transistor 18 includes a gate dielectric layer 11, a gate conductive layer 13 provided on the gate dielectric layer 11, and first and second impurity regions 17 and 19 that define source/drain regions. Also, a plug 20 is electrically connected to the switching transistor 18, and an adjacent transistor (not shown) is isolated by an element isolation region 16.

The ferroelectric capacitor 30 includes a barrier layer 14, a first electrode 32 laminated on the barrier layer 14, a ferroelectric layer 34 laminated on the first electrode 32, and a second electrode 36 laminated on the ferroelectric layer 34. Also, the ferroelectric capacitor 30 is provided on the plug 20 that is provided in the dielectric layer 26.

The plug 20 is formed on the second impurity region 19, and includes a plug conductive layer 22 provided in an opening section (contact hole) 24. The plug conductive layer 22 is composed of a high melting point metal, such as, for example, tungsten, molybdenum, tantalum, titanium, nickel or the like, and may preferably be composed of tungsten.

The barrier layer 14 is formed on the plug 20 in a manner to be electrically connected to the plug conductive layer 22 of the plug 20. The barrier layer 14 may be composed of any crystalline material, conductivity and oxygen barrier capability without any particular limitation, wherein the crystalline may preferably have a (111) orientation. Because the first electrode 32 having a crystal orientation that reflects the crystal orientation of the barrier layer 14 can be formed above the barrier layer 14, the crystal orientation of the first electrode 32 can be formed in a <111> direction. As the constituent material of the barrier layer 14, for example, TiAlN, TiAl, TiSiN, TiN, TaN, and TaSiN may be enumerated. Above all, the barrier layer 14 may preferably be composed of a layer that includes titanium, aluminum and nitrogen (e.g., TiAlN). When the barrier layer 14 is composed of TiAlN, and the composition (atom ratio) of titanium, aluminum and nitrogen in the barrier layer 14 is expressed by a chemical formula Ti$_{(1-x)}$Al$_x$N$_y$, x may be in a range of 0<x≦0.3, and y may be greater than 0 (0<y).

The first electrode 32 may be composed of at least one kind of metal selected from platinum, ruthenium, rhodium, palladium, osmium and iridium, or an oxide thereof, or an alloy thereof, and may preferably be composed of platinum or iridium, and may more preferably be composed of iridium. Also, the first electrode 32 may be composed of a single layer film, or a multilayer film of laminated layers. When the first electrode 32 is crystalline, the crystal orientation of the first electrode 32 and the crystal orientation of the barrier layer 14 may preferably be in an epitaxial orientation relation at an interface between them. In this case, the crystal orientation of the ferroelectric layer 34 and the crystal orientation of the first electrode 32 may also preferably be in an epitaxial orientation relation at an interface between them.

For example, when the barrier layer 14 belongs to cubic crystal system, and its crystal orientation is in a <111> direction, or when the barrier layer 14 belongs to hexagonal crystal system, and its crystal orientation is in a <001> direction, the crystal orientation of the first electrode 32 may preferably be in a, <111> direction. With this structure, when the ferroelectric layer 34 is formed on the first electrode 32, the crystal orientation of the ferroelectric layer 34 can be readily controlled to <111> crystal axis.

The ferroelectric layer 34 includes a ferroelectric material. The ferroelectric material has a perovskite crystal structure and may be expressed by a general formula of $A_{1-b}B_{1-a}X_aO_3$. The element A includes Pb. A part of Pb may be replaced with La. The element B is composed of at least one of Zr and Ti. The element X may be composed of at least one of V, Nb, Ta, Cr, Mo, W, Ca, Sr and Mg. As a ferroelectric material included in the ferroelectric layer 34, a known material that can be used as a ferroelectric film, such as, for example, $(Pb(Zr, Ti)O_3)$ (PZT), $SrBi_2Ta_2O_9$ (SBT), and $(Bi, La)_4Ti_3O_{12}$ (BLT) can be enumerated. Among the materials listed above, PZT is suitable as the material of the ferroelectric layer 34. In this case, the first electrode 32 may preferably be composed of iridium from the viewpoint of the device reliability.

When PZT is used as the material of the ferroelectric layer 34, the content of titanium in the PZT may preferably be greater than the content of zirconium in order to obtain a greater amount of spontaneous polarization. The PZT with such a composition belongs to tetragonal crystal, and its spontaneous polarization axis is the c-axis. However, in this case, because an a-axis orientation component that is orthogonal to the c-axis concurrently exists therein, and the a-axis orientation component does not contribute to polarization reversal when the PZT is c-axis oriented, there is a possibility that its ferroelectric characteristics may be lost. In contrast, by controlling the crystal orientation of PZT used in the ferroelectric layer 34 in a <111> direction, the a-axis can be oriented in a direction that is shifted off through a predetermined angle from the normal line of the substrate. In other words, the polarization axis has a component in a direction normal to the substrate, and therefore can contribute to polarization reversal. Accordingly, when the ferroelectric layer 34 is composed of PZT, and the content of titanium in the PZT is greater than the content of zirconium therein, the PZT shows (111) preferable orientation, because the hysteresis characteristic of the PZT is excellent in this orientation.

The second electrode 36 may be composed of any of the materials described above as an example of the material that can be used as the first electrode 32, or may be composed of aluminum, silver, nickel or the like. Also, the second electrode 36 may be in a single layer film, or a multilayer film of laminated layers. The second electrode 36 may preferably be composed of platinum or a laminated film of layers of iridium oxide and iridium.

An interlayer dielectric film 40 is formed over the ferroelectric capacitor 30, and a contact hole 45 that opens to the surface of the second electrode 36 of the ferroelectric capacitor is formed in the interlayer dielectric film 40. A wiring (local interconnect) 44 that connects the ferroelectric capacitor 30 (more specifically, the second electrode 36) and a peripheral circuit (not shown) is formed in the contact hole 45 and on the interlayer dielectric film 40. The wiring 44 in accordance with the present embodiment has a two-layer structure.

Concretely, the wiring 44 has a base layer (first wiring layer) formed on the second electrode 36 and the interlayer dielectric film 40, and a wiring main layer (second wiring layer) 42 formed on the base layer 41. In the present embodiment, the wiring 44 is provided in a manner to cover the ferroelectric capacitor 30 as viewed in a plan view, and adds a high hydrogen barrier property to the ferroelectric capacitor 30.

The base layer 41 is composed of titanium nitride (TiN) oriented to a <111> direction, and formed by nitriding a titanium film formed on an interior surface of the contact hole 45 and on the interlayer dielectric film 40. It is noted that, as the base layer 41, for example, a c-axis oriented titanium film may be used. On the other hand, the wiring main layer 42 is composed of titanium aluminum nitride (TiAlN), and is formed to have an (111)-orientation, reflecting the crystal structure of the base layer 41. The titanium aluminum nitride composing the wiring main layer 42 may be expressed by $Ti_{(1-x)}Al_xN_y$ ($0<x\leq0.3$, $0.5\leq y\leq1.5$). When the nitrogen composition ratio y of the titanium aluminum nitride is less than 0.5, the oxidation resistance property may become slightly lower, and the hydrogen barrier property may also become slightly lower, because the nitrogen content is extremely low. When the nitrogen composition ratio y of the titanium aluminum nitride exceeds over 1.5, the resistance value may become slightly higher, because the nitrogen content is extremely high.

The base layer 41 may have a film thickness of 5 nm-50 nm, and the wiring main layer 42 may have a film thickness of 50 nm-300 nm. When the film thickness of the base layer 41 is less than 5 nm, film formation may become difficult, and its orientation control function described above may become difficult to sufficiently come out. On the other hand, when the film thickness exceeds over 50 nm, this may lead to a decline in the characteristics of the wiring 44 to be formed. When the film thickness of the wiring main layer 42 is less than 50 nm, the resistance of the wiring 44 would become higher.

In the ferroelectric memory device 100 in accordance with the present embodiment equipped with the structure described, the wiring 44 that electrically connects the ferroelectric capacitor 30 (i.e., the second electrode 36) and a peripheral circuit has the wiring main layer 42 that is composed of titanium aluminum nitride oriented to a <111> direction, such that the wiring 44 has an excellent crystal orientation. The wiring 44 having such an excellent crystal orientation can suppress an increase in the resistance value, even when the wiring is fully nitrided by increasing the amount of nitrogen content to a high level. Also, because the wiring can be sufficiently nitrided with a large amount of nitrogen content, the constituent element Al can be prevented from becoming free and diffusing into the ferroelectric capacitor 30; the oxidation resistance of the wiring 44 can be prevented from being deteriorated; and the wiring 44 can be provided with a hydrogen barrier capability. As a result, the ferroelectric memory device 100 becomes highly reliable.

Method For Manufacturing Ferroelectric Memory Device

Next, an example of a method for manufacturing a ferroelectric memory device 100 shown in FIG. 1 is described with reference to the accompanying drawings. FIGS. 3A-3D, FIGS. 4A-4D, and FIGS. 5A-5B are cross-sectional views schematically showing steps of a process for manufacturing the ferroelectric memory device 100 shown in FIG. 1. It is noted that, in FIGS. 3 through 5, portions of the structure of the ferroelectric memory device 100 shown in FIG. 1 may be omitted, and the details of the omitted portions should be referred to FIG. 1.

The method for manufacturing the ferroelectric memory device 100 in accordance with the embodiment of the invention generally includes the steps of: forming, on a substrate 10, a transistor (active device) 18; forming an interlayer dielectric film 26 on the substrate 10 including the transistor 18; forming a contact hole 24 in the interlayer dielectric film 26; forming a plug 20 in the contact hole 24; forming a barrier layer 14 above the plug 20; forming a ferroelectric capacitor 30 by laminating a first electrode 32, a ferroelectric layer 34 and a second electrode 36 above the barrier layer 14; forming an interlayer dielectric film 40 over the ferroelectric capacitor 30; forming a contact hole 45 in the interlayer dielectric film 40; and forming a wiring 44 in the contact hole 45.

Figure 3A:
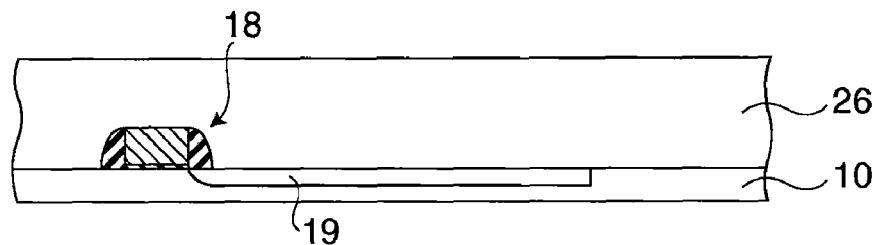
FIGS. 3A-3D are cross-sectional views schematically showing steps of a method for manufacturing the ferroelectric memory device shown in FIG. 1.

First, as shown in FIG. 3A, the transistor (active device) 18, and first and second impurity regions 17 and 19 defining source/drain regions (a part of illustration omitted) are formed in the substrate 10, and then the interlayer dielectric film 26 is formed on the substrate 10 including the transistor 18.

Figure 3B:
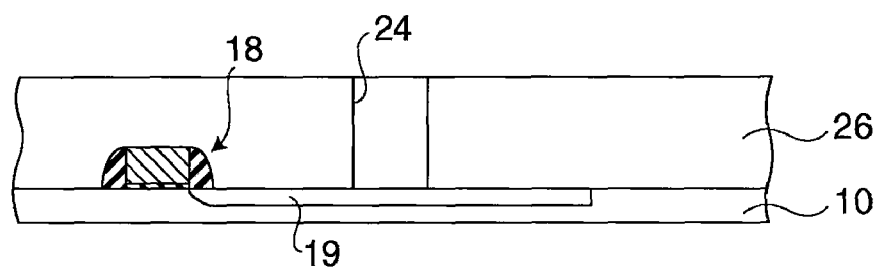
Figure 3C:
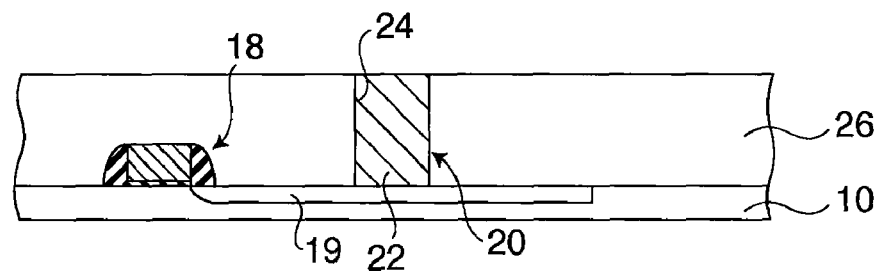

Next, as shown in FIG. 3B, an opening section (contact hole) 24 is formed in the interlayer dielectric layer 26 by, for example, dry etching. Further, as shown in FIG. 3C, the opening section 24 is embedded with a plug conductive layer 22 conductively connected to the transistor 18, thereby forming the plug 20. The plug conductive layer 22 may be embedded by, for example, a CVD method or a sputter method, and the plug conductive layer 22 deposited on the upper surface of the dielectric layer 26 is removed by, for example, mechanical chemical polishing, whereby the plug 20 is formed. The interlayer dielectric film 26 is formed from a silicon oxide film, and the plug conductive layer 22 is formed from tungsten.

In accordance with the present embodiment, an ammonia plasma treatment is applied to the interlayer dielectric film 26 including the plug 20 thus formed. More concretely, plasma of ammonia gas is excited, and the plasma is irradiated to the surface of the plug 20 and the interlayer dielectric film 26. The ammonia plasma treatment may be conducted under conditions with, for example, a flow quantity of ammonia gas to be introduced in a treatment chamber being 350 sccm, a pressure in the chamber being 1 Torr, a substrate temperature being 400° C., a power of high frequency power supply at 13.56 MHz to be supplied to the substrate being 100 W, a power of high frequency power supply at 350 MHz to be supplied to the plasma generation region being 55 W, an electrode-to-substrate distance being 350 mm, and a plasma irradiation duration being 60 seconds.

Figure 3D:
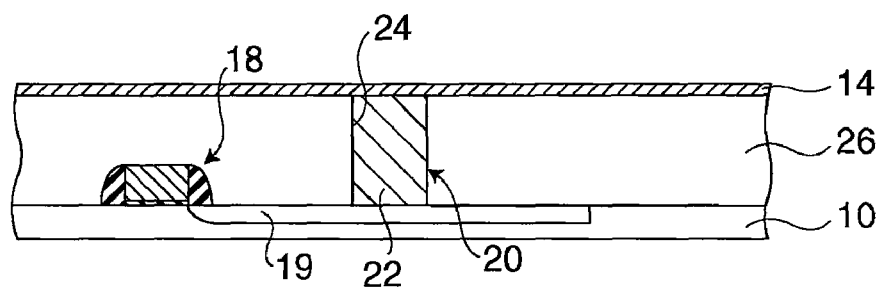

Next, as shown in FIG. 3D, the barrier layer 14 is formed on the plug 20 and the interlayer dielectric film 26. As the film forming method to form the barrier layer 14, an appropriate method may be selected according to the material of the barrier layer 14, and for example, a sputter method and a CVD method may be enumerated. Because the base of the barrier layer 14 is treated by ammonia plasma as described above, the barrier layer 14 has an excellent orientation property. The barrier layer 14 may preferably be crystalline, and more preferably, have a (111) orientation. For example, when the barrier layer 14 is composed of a layer containing titanium, aluminum and nitrogen, the barrier layer 14 may be composed of TiAlN with a (111) orientation. When the barrier layer 14 has a (111) orientation, the crystal orientation of the first electrode 32 to be formed later can be oriented to a <111> direction. By this, a ferroelectric layer 34 that is to be formed on the first electrode 32 can be oriented to a <111> direction.

As described above, when the ferroelectric layer 34 is composed of PZT, and the content of titanium in the PZT is greater than the content of zirconium, the crystal orientation of the PZT may preferably be in a <111> direction, because the PZT has favorable hysteresis characteristics in this orientation. Accordingly, by making the crystal orientation of the barrier layer 14 in a <111> direction the first electrode 32 and the ferroelectric layer 34 can both be oriented to a <111> direction, such that the ferroelectric capacitor 30 with excellent hysteresis characteristics can be obtained. It is noted that the substrate temperature at which the barrier layer 14 is grown may appropriately be selected, for example, between room temperature and 500° C. without any particular limitation.

Figure 4A:
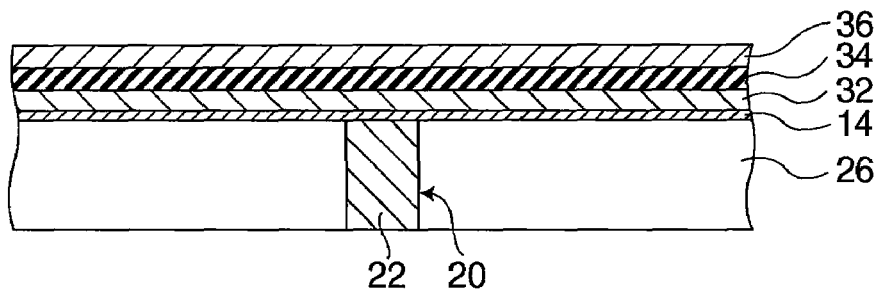
FIGS. 4A-4D are cross-sectional views schematically showing steps of the method for manufacturing the ferroelectric memory device, succeeding FIG. 3D.

Then, as shown in FIG. 4A, the first electrode 32 is formed on the barrier layer 14. It is noted that, by forming the first electrode 32 that is crystalline on the barrier layer 14, the crystallinity of the first electrode 32 is considerably improved, and the crystal orientation of the barrier layer 14 can be reflected in the first electrode 32. For example, when the crystal orientation of the barrier layer 14 is in a <111> direction, the first electrode 32 can be formed with a (111) orientation. The first electrode 32 may be formed by any one of suitable film forming methods to be selected according to the material of the first electrode 32, and may be formed by, for example, a sputter method or a CVD method.

Next, as shown in FIG. 4A, the ferroelectric layer 34 is formed on the first electrode 32. It is noted that, by forming the ferroelectric layer 34 on the first electrode 32, the crystal orientation of the first electrode 32 can be reflected in the ferroelectric layer 34. For example, when at least a portion of the first electrode 32 is crystalline with a (111) orientation, the crystal orientation of the barrier layer 14 can be formed with a <111> direction. The ferroelectric layer 34 may be formed by any one of suitable film forming methods to be selected according to the material of the ferroelectric layer 34, and may be formed by, for example, a spin-on method, a sputter method, or a MOCVD method.

Next, as shown in FIG. 4A, the second electrode 36 is formed on the ferroelectric layer 34. The second electrode 36 may be formed by any one of suitable film forming methods to be selected according to the material of,the second electrode 36, and may be formed by, for example, a sputter method or a CVD method.

Figure 4B:
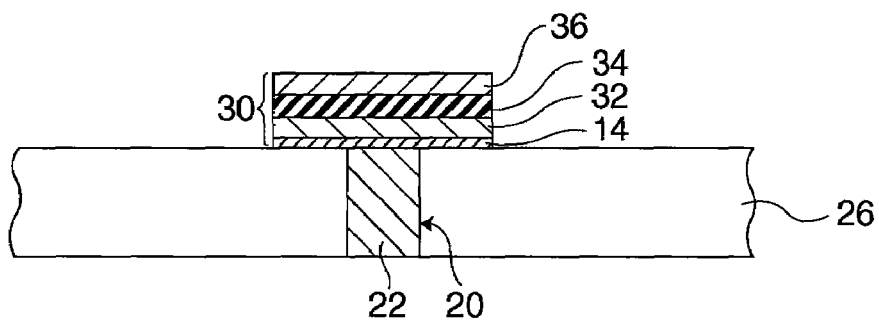

Then, a resist layer having a specified pattern is formed on the second electrode 36, and the laminated layers of the barrier layer 14 through the second electrode 36 are patterned by a photolithography method, using the resist layer as a mask. By this, a stacked type ferroelectric capacitor 30 can be obtained, as shown in FIG. 4B.

Figure 4C:
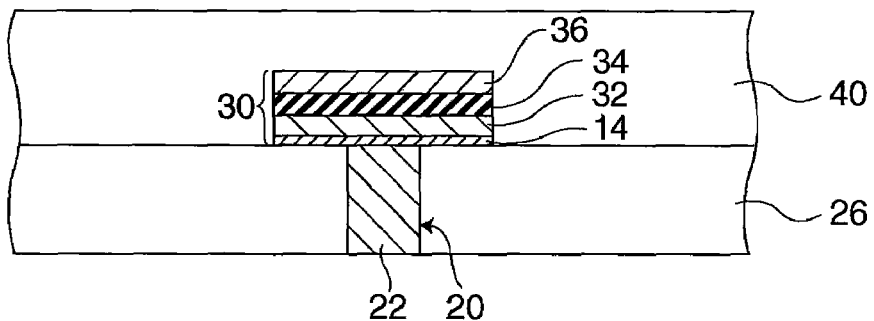
Figure 4D:
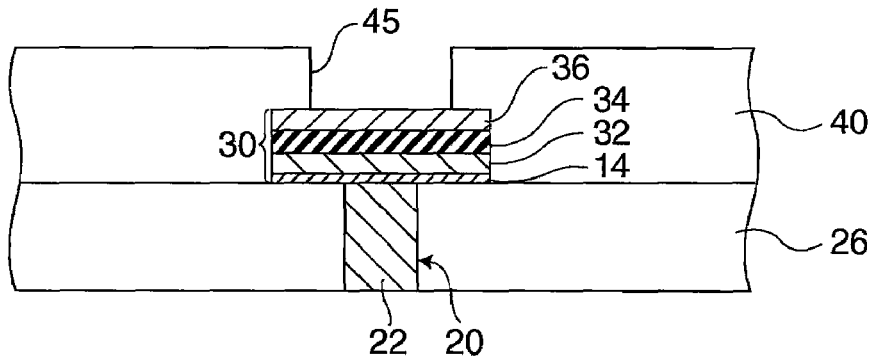

Then, as shown in FIG. 4C, the interlayer dielectric film 40 is formed on the ferroelectric capacitor 30 thus formed, and an opening section (contact hole) 45 is formed in the interlayer dielectric film 40 by dry etching or the like, as shown in FIG. 4D. It is noted that the opening section 45 opens to a depth at which the surface of the second electrode 36 of the ferroelectric capacitor 30 is exposed.

Figure 5A:
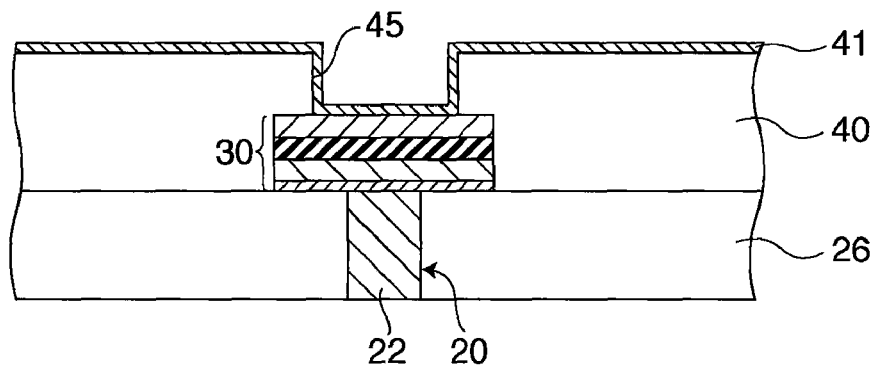
FIGS. 5A and 5B are cross-sectional views schematically showing steps of the method for manufacturing the ferroelectric memory device, succeeding FIG. 4D.

Then, as shown in FIG. 5A, a titanium nitride layer 41 is formed on the interlayer dielectric film 40 including on the inside of the opening section 45. It is noted that an ammonia plasma treatment may be applied to the interior of the opening section 45 and on the interlayer dielectric film 40, and then a titanium layer is formed inside the opening section 45 and on the interlayer dielectric film 40, and a nitriding treatment is applied to the titanium layer, thereby forming a base layer 41 composed of a titanium nitride layer.

According to the forming method described above, titanium in the opening section 45 and on the interlayer dielectric film 40 treated with an ammonia plasma treatment is formed into a titanium layer having an excellent self-orientation property, exhibiting an (001) orientation. The titanium nitride layer, which is formed by applying a nitriding treatment to the titanium layer, has an (111) orientation. It is noted that the nitriding treatment is a heat treatment (at 500° C.-650° C.) that is conducted in an atmosphere including nitrogen, to thereby change a titanium layer to a titanium nitride layer. If the temperature of the heat treatment exceeds over 650° C., the characteristics of the transistor 18 may be affected. On the other hand, the temperature of the heat treatment that is lower than 500° C. is not desirable, because the time required for nitirization of the titanium layer becomes too long.

The base layer 41 formed is a functional layer for controlling the crystal orientation property of the wiring main layer 42 composed of titanium aluminum nitride to be formed as an upper layer, and may preferably have a film thickness of about 5 nm-50 nm to bring out the controlling function. If the film thickness is less than 5 nm, the film formation may become difficult, and the orientation controlling function may become difficult to come out. On the other hand, the film thickness that exceeds over 50 nm may lead to a decline in the characteristics of the wiring 44 to be formed.

Figure 5B:
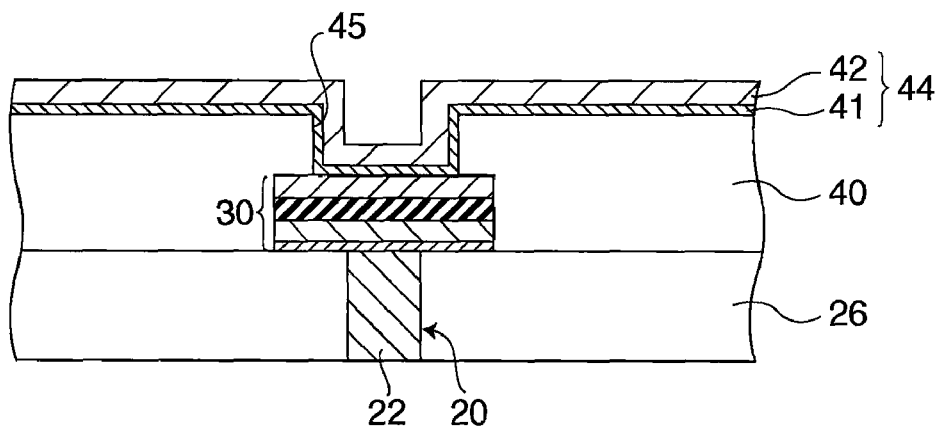

Next, as shown in FIG. 5B, the wiring main layer 42 composed of titanium aluminum nitride is formed on the base layer 41 composed of titanium nitride. More concretely, a film of titanium aluminum nitride ($Ti_{(1-x)}Al_xN_y$) is formed on the base layer 41 by a sputter method or a CVD method. The titanium aluminum nitride thus formed excels in crystallinity, and exhibits an (111) orientation, reflecting the crystal structure of the base layer 41. The wiring 44 is formed by a laminated film of the base layer 41 and the wiring main layer 42 described above. Then, the wiring 44 is formed into a predetermined pattern by a patterning technique such as a photolithography method or the like, whereby the ferroelectric memory device 100 in accordance with the embodiment of the invention is manufactured.

According to the method for manufacturing the ferroelectric memory device 100 of the present embodiment described above, the following effects are obtained.

First, in the step of forming the wiring 44, the base layer 41 (first wiring layer) composed of titanium nitride oriented in a <111> direction is formed, and then the titanium aluminum nitride film is formed on the base layer 41, whereby the titanium aluminum nitride reflects the crystal structure of the base layer 41 and thus is provided with an (111)-orientation, and therefore the wiring 44 having an excellent crystal orientation can be formed. Because the wiring 44 with an excellent crystallinity is formed, an increase in the resistance value can be suppressed even when the wiring 44 is fully nitrided by increasing the amount of nitrogen content in titanium aluminum nitride to a high level. Also, because the wiring can be sufficiently nitrided with a large amount of nitrogen content, the constituent element Al of the wiring 44 (the wiring main layer 42) can be prevented from becoming free and diffusing into the ferroelectric capacitor 30; the oxidation resistance property of the wiring 44 can be prevented from being weakened; and the wiring 44 can be provided with a hydrogen barrier capability. As a result, a highly reliable ferroelectric memory device 100 can be provided.

Figure 2:
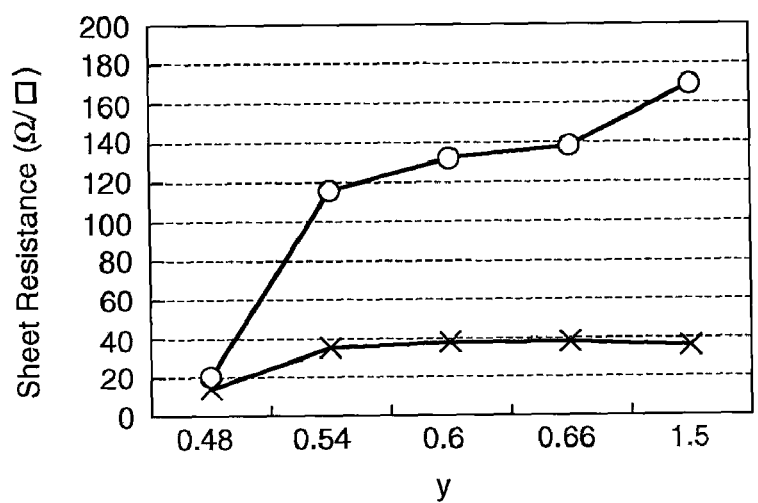
FIG. 2 is a graph showing resistance values with respect to nitrogen (N) contents in wirings formed in the ferroelectric memory device in FIG. 1 and wirings formed in a comparison example.

FIG. 2 is a graph that plots sheet resistance values with respect to contents y of nitrogen (N) in wiring main layers 42. In the graph, circular dots (O) indicate resistance values of wirings that are composed solely of titanium aluminum nitride without forming a base layer 41, and cross (x) marks indicate resistance values of wirings 44 each composed of a base layer 41 and a wiring main layer 42 formed thereon in accordance with the embodiment of the invention. By forming the base layers 41, the resistance values can be suppressed substantially low.

Figure 6:
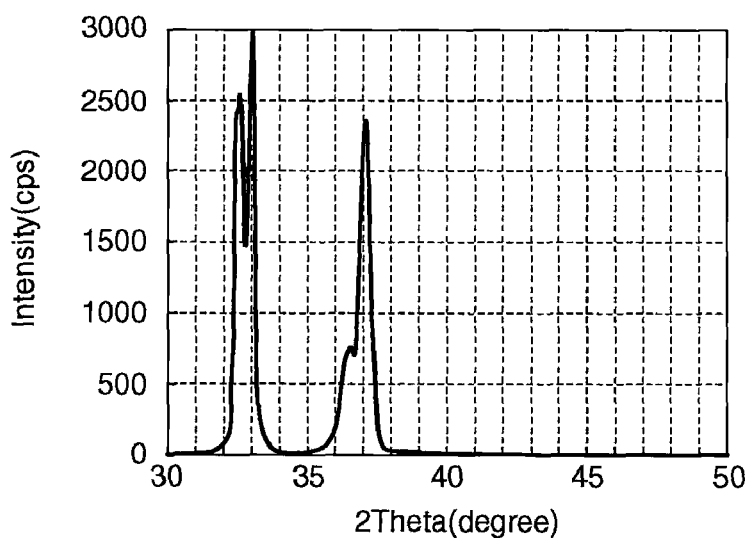
FIG. 6 is an X-ray diffraction chart of a wiring that is formed in the ferroelectric memory device shown in FIG. 1.
Figure 7:
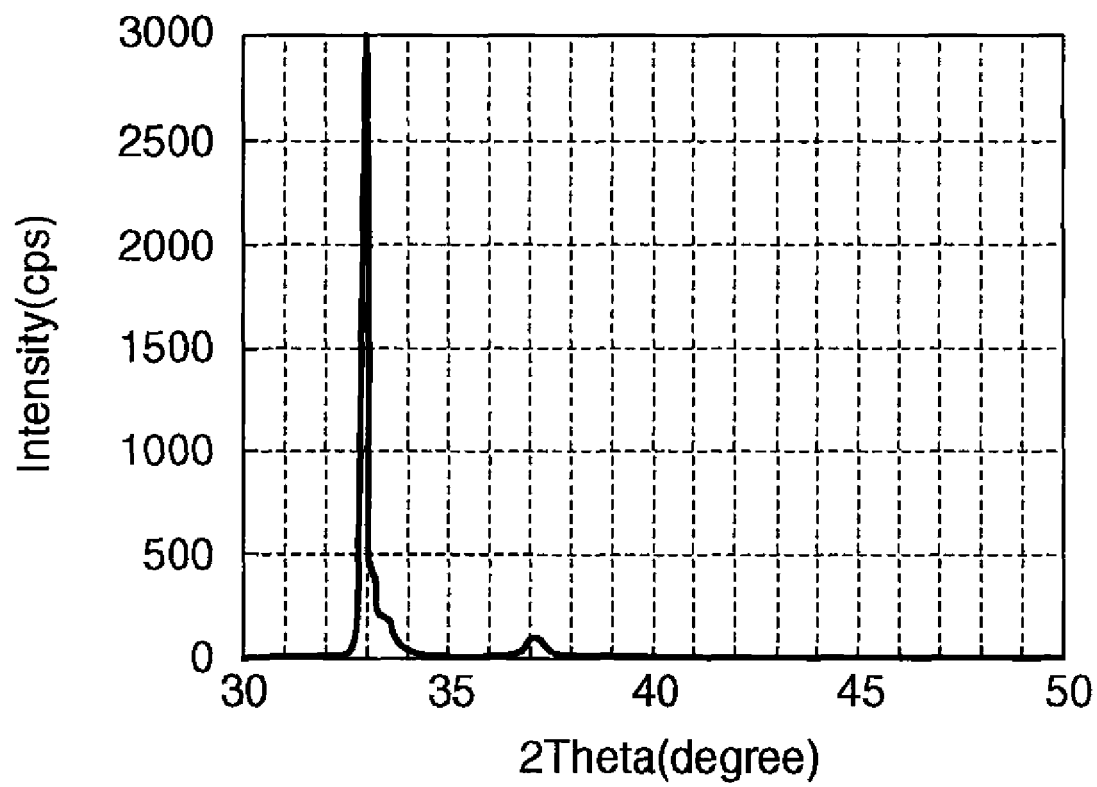
FIG. 7 is an X-ray diffraction chart of a wiring in accordance with a comparison example.

Also, FIG. 6 is an X-ray diffraction chart of the wiring 44 in accordance with the present embodiment, and FIG. 7 is an X-ray diffraction chart of a wiring that is composed solely of titanium aluminum nitride without forming a base layer 41. In the X-ray diffraction chart of the titanium aluminum nitride, a diffraction peak near 2θ=37° indicates an (111)-orientation. It is observed that, when the wiring 44 is formed by forming the wiring main layer 42 composed of titanium aluminum nitride on the base layer 41 composed of titanium nitride oriented in a <111> direction, the wiring 44 is oriented highly in a, <111> direction. By increasing the crystal orientation of the wiring 44 to a higher level, the resistance value does not increase even when the wiring main layer 42 is fully nitrized.

The embodiment of the invention is described above. However, the invention is not limited to the embodiment described above. For example, the wiring main layer 42 is laminated on the base layer 41 in accordance with the present embodiment, but an intermediate layer may be placed between the base layer 41 and the wiring main layer 42, as long as the crystal orientation of the wiring main layer 42 is not damaged.

What is claimed is:

1. A ferroelectric memory device, comprising:
   a substrate;
   a ferroelectric capacitor formed on a substrate;
   a barrier layer disposed directly between the ferroelectric capacitor and the substrate, the barrier layer having a composition expressed by $Ti_{(1-x)}Al_xN_y$ ($0 < x \leq 0.3$, $0 < y$);
   a first wiring layer disposed above and connected to the ferroelectric capacitor, the first wiring layer including titanium nitride, and being oriented in a <111> direction; and
   a second wiring layer formed above the first wiring layer, the second wiring layer including titanium aluminum nitride, a composition of which is expressed by $Ti_{(1-x)}Al_xN_y$ ($0 < x \leq 0.3$, $y=1.5$), and being oriented in a <111> direction.

2. The ferroelectric memory device according to claim 1, a thickness of first wiring layer being within a range of 5 nm to 50 nm.

3. The ferroelectric memory device according to claim 1, further comprising:
   a transistor formed above the substrate;
   a first interlayer dielectric film formed between the ferroelectric capacitor and the substrate;
   a contact plug formed in the first interlayer dielectric film, the contact plug electrically connecting the transistor and the ferroelectric capacitor; and
   a second interlayer dielectric film formed between the first wiring layer and the first interlayer dielectric film and covering a portion of the ferroelectric capacitor.

4. A ferroelectric memory device, comprising:
   a substrate;
   a first interlayer dielectric film formed above the substrate, the first interlayer dielectric film including a contact plug;
   a barrier layer formed above the first interlayer dielectric film, the barrier layer including TiAlN and being oriented in a <111> direction;
   a first electrode formed above the barrier layer, the first electrode being oriented in a <111> direction;
   a ferroelectric layer formed above the first electrode, the ferroelectric layer being oriented in a <111> direction;
   a second electrode formed above the ferroelectric layer, the first electrode, the ferroelectric layer and the second electrode forming a ferroelectric capacitor;
   a second interlayer dielectric film formed above the first interlayer dielectric film, the second interlayer dielectric film covering a portion of the capacitor;
   a first wiring layer formed above the second interlayer dielectric and electrically connected to the ferroelectric capacitor, the first wiring layer including titanium nitride and being oriented in a <111> direction; and
   a second wiring layer formed above the first wiring layer, the second wiring layer including titanium aluminum nitride, a composition of which is expressed by $Ti_{(1-x)}Al_xN_y$ ($0 < x \leq 0.3$, $y=1.5$) and being oriented in a <111> direction.

5. The ferroelectric memory device according to claim 4, the ferroelectric layer including a PZT.

6. The ferroelectric memory device according to claim 4, the contact plug and the first interlayer dielectric layer being treated by ammonia plasma.

7. The ferroelectric memory device according to claim 4, the second interlayer dielectric film including an opening portion formed above the ferroelectric capacitor, the first wiring being extended into the opening portion and electrically connected to the ferroelectric capacitor, the second interlayer dielectric film being treated by ammonia plasma.

8. The ferroelectric memory device according to claim 4, the contact plug including tungsten.

* * * * *